(12) United States Patent
Kozawa et al.

(10) Patent No.: US 9,165,699 B2
(45) Date of Patent: Oct. 20, 2015

(54) ELECTROMAGNETIC SHIELDING TUBE AND STRUCTURE OF SHIELDED CABLE, METHOD FOR BENDING ELECTROMAGNETIC SHIELDING TUBE, METHOD FOR MANUFACTURING ELECTROMAGNETIC SHIELDING TUBE, AND METHOD FOR PROCESSING TERMINAL OF SHIELDED CABLE

(71) Applicant: FURUKAWA ELECTRIC CO., LTD., Chiyoda-ku, Tokyo (JP)

(72) Inventors: Satoshi Kozawa, Tokyo (JP); Syunji Yamamoto, Tokyo (JP); Tetsuji Kubota, Tokyo (JP); Takuzo Hagiwara, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 42 days.

(21) Appl. No.: 13/894,763

(22) Filed: May 15, 2013

(65) Prior Publication Data
US 2013/0341060 A1    Dec. 26, 2013

Related U.S. Application Data

(63) Continuation of application No. PCT/JP2012/065887, filed on Jun. 21, 2012.

(51) Int. Cl.
*H02G 3/04* (2006.01)
*H01B 7/20* (2006.01)
*H05K 9/00* (2006.01)

(52) U.S. Cl.
CPC .............. *H01B 7/202* (2013.01); *H02G 3/0481* (2013.01); *H05K 9/0007* (2013.01); *H05K 9/0098* (2013.01)

(58) Field of Classification Search
CPC . H02G 3/0481; H02G 3/0462; H02G 3/0468; H05K 9/0007; H05K 9/0098; H05K 9/0009; H01B 7/202
USPC ......... 174/68.1, 68.3, 72 A, 73.1, 88 R, 70 C, 174/34, 32, 350, 95, 99 R; 248/49, 68.1; 427/77
See application file for complete search history.

(56) References Cited

U.S. PATENT DOCUMENTS 5,313,017 A * 5/1994 Aldissi ............................ 174/34
5,473,113 A * 12/1995 Aldissi ............................ 174/34
(Continued)

FOREIGN PATENT DOCUMENTS

JP          6137468 A      5/1994
JP        09-298382 A     11/1997
(Continued)

OTHER PUBLICATIONS

Office Action mailed Aug. 27, 2013, corresponds to Japanese patent application No. 2012-549183.
(Continued)

*Primary Examiner* — Angel R Estrada
(74) *Attorney, Agent, or Firm* — Hauptman Ham, LLP

(57) ABSTRACT

A shielded cable is mainly configured by an electromagnetic shielding tube, a terminal, and an electric wire or the like. An electric wire is inserted into an inside of the electromagnetic shielding tube. The terminal is connected to both end portions of the electric wire that serves as a covered wire. In the present invention, a structure in which the terminal is connected to the electric wire is called a structure of a shielded cable. The electromagnetic shielding tube is configured by an inner layer made of plastic, a metal layer made of metal, and an outer layer made of plastic. The electromagnetic shielding tube is configured such that the inner layer is formed on an innermost layer, the outer layer is formed on an outermost layer, and the metal layer is formed between the inner layer and the outer layer.

18 Claims, 12 Drawing Sheets

(a)

(b)

(56) References Cited

U.S. PATENT DOCUMENTS

| | | | |
|---|---|---|---|
| 6,225,556 B1 * | 5/2001 | Saito | 174/34 |
| 8,487,184 B2 * | 7/2013 | Rivernider et al. | 174/68.1 |
| 2011/0094796 A1 | 4/2011 | Toyama et al. | |

FOREIGN PATENT DOCUMENTS

| JP | 2000274978 A | 10/2000 |
|---|---|---|
| JP | 200694619 A | 4/2006 |
| JP | 2007-012514 A | 1/2007 |
| JP | 2007-081158 A | 3/2007 |
| JP | 2011-097692 A | 5/2011 |
| JP | 2011-138470 A | 7/2011 |
| JP | 2012-029385 A | 2/2012 |
| JP | 201235803 A | 2/2012 |
| JP | 2012-065448 A | 3/2012 |
| JP | 2012165562 A | 8/2012 |
| JP | 2013109935 A | 6/2013 |

OTHER PUBLICATIONS

International Search Report corrsponding to PCT/JP2012/065887, dated Oct. 2, 2012.

* cited by examiner (a)

(b)

(a)

(b)

(a)

(b)

(c)

(a)

(b)

(c)

(a)

(b)

(c)

(d)

(a)

(b)

(a)

(b)

ELECTROMAGNETIC SHIELDING TUBE AND STRUCTURE OF SHIELDED CABLE, METHOD FOR BENDING ELECTROMAGNETIC SHIELDING TUBE, METHOD FOR MANUFACTURING ELECTROMAGNETIC SHIELDING TUBE, AND METHOD FOR PROCESSING TERMINAL OF SHIELDED CABLE

RELATED APPLICATIONS

The present application is a continuation of International Application Number PCT/JP2012/065887, filed Jun. 21, 2012. The above listed application is hereby incorporated by reference in its entirety.

FIELD

The present invention relates to an electromagnetic shielding tube into which an electric wire is inserted, a structure of a shielded cable using the same, a method for bending an electromagnetic shielding tube, a method for manufacturing an electromagnetic shielding tube, and a method for processing a terminal of a shielded cable.

BACKGROUND

Conventionally, as a protective tube for a cable, a metal tube, such as a steel tube and an aluminum tube, and a plastic corrugated tube are used. When using such a tube, there might be a problem such as an influence of noise generated from a cable that is accommodated in the protective tube and an influence of noise from an outside, which affects the internal cable. For example, in a hybrid car, it is necessary to protect a cable that supplies a three-phase alternating current output from an inverter device to a drive motor. Accordingly, a protective tube is arranged, such as on a bottom portion of a body of the car, according to the shape of the body. In this process, because the cable generates noise that is heard in a radio or the like, it is necessary to prepare shielding.

As such a protective tube, there is a tube made of metal, of which the outermost layer is made of stainless-steel and the other layers are made of iron in order to improve endurance (patent document 1).

Furthermore, as a plastic corrugated tube, there is a corrugated tube of which the metal layer is formed by plating (patent document 2).

PRIOR ART DOCUMENT

Patent Document(s)

[Patent document 1] Japanese Patent Application Laid-Open No. 2007-81158 A
[Patent document 2] Japanese Patent Application Laid-Open No. H09-298382 A

SUMMARY

Technical Problems

However, because a metal tube according to the patent document 1 is made of metal, there is a problem of the weight. If reducing the thickness of the metal tube as measures against this problem, a bending portion is crushed and becomes flat at the time of bending, and thereby it becomes difficult to keep a predetermined inside diameter. Furthermore, a metal tube requires a certain amount of thickness, and therefore a large-sized processing machine is needed for bending. In this way, a metal tube has no good workability in view of processing it into the shape of a product.

Furthermore, a metal tube has a possibility that a dent is formed easily when shock is applied to an outer surface thereof by splattering of stones or the like. Additionally, when stainless-steel is used for a metal tube as in the patent document 1, it costs much. Moreover, such a protective tube has a possibility that moisture can adhere to the inside of the tube by dew condensation or the like in addition to adhesion of water from an outside. For the reasons above, even if only an outermost layer of the tube is made of stainless-steel, a problem of corrosion cannot be solved completely.

On the other hand, in the method of forming a metal layer on a plastic corrugated tube described in the patent document 2 by applying an electroless plating method, there is a limitation on the thickness of the metal layer which produces an effect of shielding. In this way, it is difficult to secure both the high shielding property and the adherence of a metal layer to a plastic layer. In addition, a plastic corrugated tube usually has flexibility. Therefore, when fixing the corrugated tube on a vehicle, it is necessary to place the corrugated tube in a predetermined position of the vehicle and fix predetermined portions of the tube by adjusting the position. In this way, a corrugated tube requires a number of components for fixation, and therefore workability for placing and fixing the corrugated tube on a vehicle becomes low.

Furthermore, a metal layer is adhered to a plastic corrugated tube by plating, and therefore there are problems such as peeling of plating and corrosion of plating.

The present invention was made in view of such problems, and an object of the present invention is to provide an electromagnetic shielding tube, in which corrosion and a dent on a surface are difficult to be generated and which produces the high shielding property and the shape retaining property, and a structure of a shielded cable, a method for bending an electromagnetic shielding tube, a method for manufacturing an electromagnetic shielding tube, and a method for processing a terminal of a shielded cable.

Solution to Problems

In order to achieve the object described above, a first aspect of the present invention provides an electromagnetic shielding tube that enables an electric wire to be inserted therein, comprising: an inner layer made of plastic; a metal layer formed on an outer periphery of the inner layer; an outer layer made of plastic and formed on an outer periphery of the metal layer, wherein the electromagnetic shielding tube is a multiple-unit tube in which the inner layer, the metal layer, and the outer layer are integrally formed, and the electromagnetic shielding tube has shape retaining property that keeps a bended shape by rigidity after plastic deformation of the metal layer, which is larger than restoring force accompanied with elastic deformation of the inner layer and the outer layer after, the electromagnetic shielding tube is bended.

It is desired that both ends of a metal sheet member are overlapped with each other in a wrapping portion to form the metal layer and the wrapping portion is formed in a shape of a roll such that facing surfaces of both the ends of the metal sheet member are directly joined. The both ends of a metal sheet member are overlapped with each other in a wrapping portion to form the metal layer and the wrapping portion can be formed in a shape of a roll such that facing surfaces of both the ends of the metal sheet member contact with each other without being joined.

It is desired that at least either thickness of the inner layer or thickness of the outer layer is thicker than thickness of the metal layer, and the thickness of the outer layer is thinner than the thickness of the inner layer or the thickness of the outer layer is equal to the thickness of the inner layer. It is desired that the metal layer is formed by any of aluminum, an aluminum alloy, copper, or a copper alloy. It is desired that resin that constitutes the inner layer or the outer layer is polyolefin resin, such as polypropylene and polyethylene, and thermoplastic resin, such as polyamide and poly butylene terephthalate.

The outer layer can include an additive agent for improving at least either of flame retardance or weather resistance, and a pigment for coloring can be added to the outer layer as necessary.

A part of the outer layer can be peeled off so that the metal layer is exposed at an end portion of the electromagnetic shielding tube.

According to the first aspect of the present invention, the metal layer is formed on the inside, and accordingly it is possible to provide the shielding property with respect to the electric wire inserted into the inside. Furthermore, the inner and outer layers are made of plastic and the metal layer is formed as an intermediate layer, and accordingly the metal layer does not become exposed on an inner surface and an outer surface and the electromagnetic shielding tube is not corroded.

Furthermore, the plastic layer has heat insulation effectiveness, and accordingly dew condensation is difficult to be occurred within the tube, and moreover, there is no problem such as the insulation breakdown of the inside electric wire due to moisture of dew condensation.

Furthermore, the thickness of the metal layer can be a minimum thickness enough to keep up the shielding property and the shape retaining property. Therefore, it is easily bended as compared to a case where the entire layers are configured by metal, and it is possible to bend the tube even without necessarily using a large-sized hydraulic bender for bending a metal tube. For the reason above, bending can be performed by hand or a simple device such as a small-sized hand bender in addition to a hydraulic bender or a mechanical pressing device.

Furthermore, the electromagnetic shielding tube has the shape retaining property (keeps the bended shape at the time of bending the multiple-unit tube and does not return to the original shape unless the external force to an extent which plastic deformation occurs to the tube is applied thereto) as a whole. For the reason above, it is possible to process the electromagnetic shielding tube beforehand in the shape in accordance with a layout fixing it to an automobile. Therefore, workability for laying the electromagnetic shielding tube excels.

Furthermore, plastic layers are particularly provided on the inner and the outer layers sides of the metal layer, and accordingly the metal layer neither crushes toward an inside nor becomes flat. In addition, the tube is mostly made of plastic as a whole, and accordingly it can be formed lighter than the one of which the entire part is made of metal. Particularly, by forming the metal layer thin and forming the inner layer or the outer layer thick, it is possible to obtain the above-described effect certainly.

Furthermore, even when a stone or the like collides at the outer periphery, the plastic outer layer having the elasticity prevents a dent or the like from being formed in the metal layer.

Furthermore, the metal layer above can be easily manufactured by forming a strip-shaped member made of metal in the shape of a circle. In order to form the metal layer, end portions of the strip-shaped member are butted to contact with each other or a wrapping portion is formed and at least some parts of the wrapping portion contact with each other. By configuring as above, electromagnetic noise can be reduced. Moreover, by joining the wrapping portion by welding or the like, leakage of noise can be prevented. In addition, the metal layer is configured by a thin strip-shaped member made of metal, and accordingly the bendability thereof excels at the time of bending. That is, flattening or the like at the time of bending can be prevented.

Additionally, by adding additive agents for improving flame retardance and weather resistance only to resin of the outer layer, an effect thereof can be obtained by a minimum amount of additive agents as compared to a case where additive agents are added to the entire layers of the tube. Similarly, by adding pigments such as a yellow pigment or an orange pigment to the resin of the outer layer, it is possible to distinguish whether a shielding layer is for high voltage or for low voltage.

Furthermore, at the same time of coloring or after coloring, a position in the resin of the outer layer, which corresponds to the wrapping portion or a center of the wrapping portion of the metal layer, can be colored to be a mark. When bending the tube so as to include the wrapping portion (a position in a circumferential direction of the wrapping portion) within a bending plane (a plane formed by a bending portion of the bended shielding tube), the wrapping portion in which end of the layers are overlapped to form a two-layer is bended as being on an outer periphery or an inner periphery, and accordingly it is possible to increase the rigidity of the metal layer after bending. Therefore, at the time of bending, it is desired to bend the tube so as to include at least such a bending portion. Considering ease of bending, it is desired to include the wrapping portion within the bending plane, and moreover, regarding a position of the wrapping portion, it is preferred to bend the tube so as to include the bending portion within an inner side of the radius of the bending portion in order to stabilize the shape after bending. At the time of bending, it is desired to join the wrapping portion or a butting portion of the metal layer by welding. When the wrapping portion or a butting portion of the metal layer is welded, the metal layer does not move between the inner layer resin and the outer layer resin at the time of bending. In addition, when bending the electromagnetic shielding tube, it is necessary to keep the shape retaining property of the electromagnetic shielding tube by the rigidity of the metal layer after plastic deformation, which is larger than the restoring force accompanied with elastic deformation of the resin of the inner layer and the outer layer. Therefore, it is necessary to design the thickness of the resin of the inner layer and the outer layer such that the rigidity of the metal layer becomes larger than the elastic restoring force of the resin.

The electromagnetic shielding tube can be bended. A wrapping portion of the metal layer can be included within a bending plane. The electromagnetic shielding tube can be bended in a plurality of different directions, and it can be bended by pressing or a bender. In this case, at least one of the wrapping portions of the metal layer can be included within the bending plane. When bending the tube in a complicated shape, a three-dimensional bending machine that provides computerized adjustment of a movement of a processing head which the electromagnetic shielding tube passes through at a predetermined speed can be used. The three-dimensional bending makes it possible to bend the tube in response to the movement of the processing head, and accordingly it is particularly suitable for bending the electromagnetic shielding tube having the complicated shape with many bending portions.

As manufactured above, a bending tube can be obtained by a method of bending by pressing and a bender, or by a three-dimensional bending. Whether which method is to be selected among the three methods above for manufacturing a tube can be determined suitably according to the shape of a product.

A mark that is continuous in an axis direction of the tube can be provided at a position, which corresponds to a wrapping portion or a center of the wrapping portion of the metal layer, in the outer layer colored by a pigment.

A second aspect of the present invention provides a structure of a shielded cable comprising the electromagnetic shielding tube according to the first aspect of the present invention, wherein an electric wire is inserted into an inside of the electromagnetic shielding tube and terminal portions that are connected to the electric wire are provided on both ends of the electromagnetic shielding tube. It is possible to ground the electromagnetic shielded cable by using the terminal portions.

A plastic corrugated tube can cover an outer periphery of the electromagnetic shielding tube. A plastic corrugated tube also can cover an outer periphery of the bended electromagnetic shielding tube. By covering the outer periphery of the electromagnetic shielding tube with the plastic corrugated tube, it is possible to protect the inside electromagnetic shielding tube. Moreover, by using a fixing metal fitting in the shape that corresponds to a concave and a convex of a corrugated portion, the electromagnetic shielding tube of an automobile or an indoor wiring can be fixed easily to a structural member.

According to the second aspect of the present invention, the electromagnetic shielding tube has the shape retaining property and the corrugated tube covers the electromagnetic shielding tube, and accordingly it is possible to lay a shielded cable easily.

A third aspect of the present invention provides a method for bending an electromagnetic shielding tube comprising the step of bending the electromagnetic shielding tube by pressing so as to include a wrapping portion of the metal layer within a bending plane when the electromagnetic shielding tube according to the first aspect of the present invention is bended.

Furthermore, the third aspect of the present invention provides a method for bending an electromagnetic shielding tube comprising the step of bending is performed so as to include a wrapping portion of the metal layer within a bending plane when the electromagnetic shielding tube according to the first aspect of the present invention is bended in a plurality of different directions. By configuring as above, it is possible to stabilize the shape of the bending portion.

A fourth aspect of the present invention provides a method for manufacturing the electromagnetic shielding tube according to the first aspect of the present invention, comprising the step of: forming the inner layer by extruding inner layer resin; forming a sheet metal as a strip-shaped member that constitutes the metal layer in a shape of a roll by a forming method such that some parts thereof are wrapped with each other and are set to be located on an outer periphery of the inner layer; and forming the outer layer by extruding outer layer resin and covering an outer periphery of the metal layer with the outer layer resin. Furthermore, a wrapping portion of the metal layer, which is extruded in the shape of a roll can be continuously joined by welding or brazing. It is possible to extrude a resin tube that more excels in the shape retaining property after bending when extruding the outer layer resin and covering the outer periphery of the metal layer with the outer layer resin after joining the wrapping portion.

A fifth aspect of the present invention provides a method for processing a terminal of a shielded cable, the method for processing a terminal of a shielded cable using the electromagnetic shielding tube according to the first aspect of the present invention, comprising the step of: peeling a part of the outer layer so that the metal layer is exposed; and connecting a terminal portion thereto so as to be conducted with the metal layer. By configuring as above, it is possible to easily connect the terminal portion to the terminal portion of the electromagnetic shielding tube.

Advantageous Effects of Invention

According to the present invention, it is possible to provide an electromagnetic shielding tube, in which corrosion and a dent of a surface are difficult to be generated and which produces the high shielding property and the shape retaining property, and a structure of a shielded cable, a method for bending an electromagnetic shielding tube, a method for manufacturing an electromagnetic shielding tube, and a method for processing a terminal of a shielded cable.

DETAILED DESCRIPTION OF THE INVENTION

Figure 1:
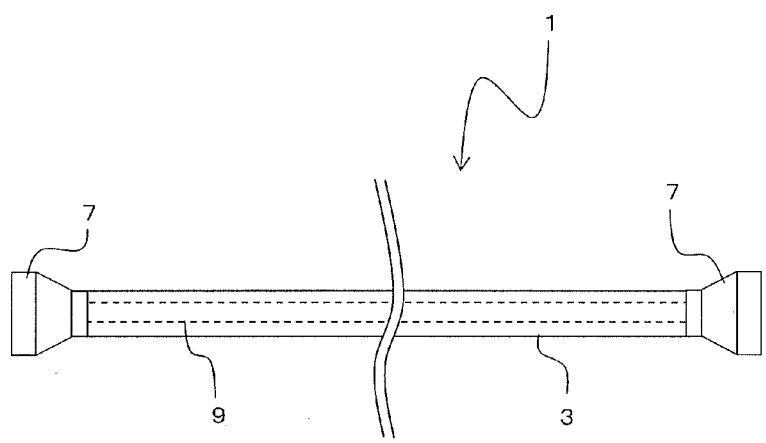
FIG. 1 illustrates a shielded cable 1.

Hereinafter, a shielded cable 1 according to an embodiment of the present invention will be described. FIG. 1 illustrates a shielded cable 1. The shielded cable 1 is mainly configured by an electromagnetic shielding tube 3, a terminal 7, and an electric wire 9 or the like.

The electric wire 9 is inserted into an inside of the electromagnetic shielding tube 3. The terminals 7 are connected to both ends of the electric wire 9 that serves as a covered wire. In the present invention, a structure in which the terminal 7 is connected to the electric wire 9 is called a structure of a shielded cable.

Figure 2:
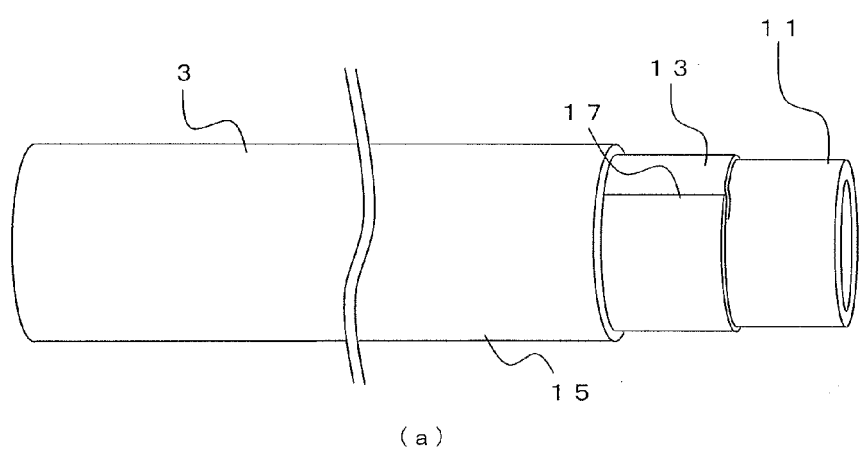
FIG. 2 illustrates an electromagnetic shielding tube 3, particularly, FIG. 2 (a) is a perspective view and FIG. 2 (b) is a cross-sectional view.
Figure 2:
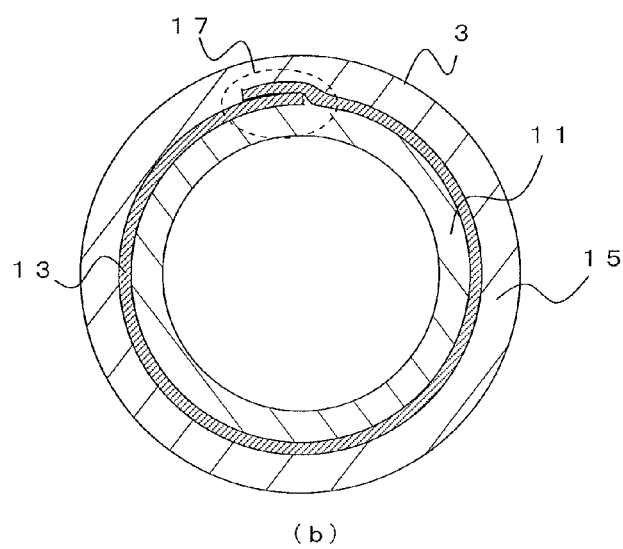

FIG. 2 illustrates an electromagnetic shielding tube 3, particularly, FIG. 2 (a) is a perspective view and FIG. 2 (b) is a cross-sectional view. The electromagnetic shielding tube 3 is configured by an inner layer 11 made of plastic, a metal layer 13 made of metal, and an outer layer 15 made of plastic. The electromagnetic shielding tube 3 is configured such that the inner layer 11 is formed on an innermost layer, the outer layer 15 is formed on an outermost layer, and the metal layer 13 is formed between the inner layer 11 and the outer layer 15.

Resin that constitutes the inner layer 11 can be identical to or different from resin that constitutes the outer layer 15. For example, the resin can be selected from polyolefin resin, such as polypropylene and polyethylene, and thermoplastic resin, such as polyamide and poly butylene terephthalate. The resin can be bridged or denatured. For example, the resin can be bridged in order to improve heat resistance and also can be denatured with maleic acid in order to improve adherence. In addition, halogenated fire retardants, phosphorous fire retardants, and metal hydrated fire retardants can be added, and oxidized titanium or the like can be added in order to improve weather resistance.

The fire retardants and the additive agents for improving weather resistance can be added only to the resin that constitutes the outer layer 15. That is, it is not necessary to add them to the resin of the inner layer 11, which requires neither flame retardance nor weather resistance.

Pigments for coloring or the like can be added to the resin that constitutes the outer layer 15. Generally, when using a protective tube as a high-voltage cable for an automobile or the like, it is necessary to distinguish it with other general protective tubes with respect to safety. For example, it is necessary to color only such the protective tube for a high-voltage wire. However, because the cable-protective tube includes an external plated layer, it is difficult to color it. For example, if a surface of a conventional protective tube is simply painted, there is a possibility that the paint is peeled.

On the other hand, the electromagnetic shielding tube 3 according to the present invention includes the outermost layer made of resin, and therefore it is possible to color the resin itself. Accordingly, by only coloring the outer layer 15, it is possible to obtain the electromagnetic shielding tube 3 that excels in appearance and is identifiable from the other peripheral tubes. In this case, the resin of the inner layer 11 does not require coloring as well.

Copper and iron can be used for the metal layer 13 as long as they provide the shielding effect, however, when considering a matter of electric conductivity, it is more desired to form the metal layer 13 by aluminum (including aluminum alloys) or copper (including copper alloys). Furthermore, when considering the weight and cost reduction, it is desired to form the electromagnetic shielding tube 3 by aluminum (including aluminum alloys).

At least either of the inner layer 11 or the outer layer 15 is formed to be thicker than the metal layer 13. For example, as illustrated in FIG. 2, both the inner layer 11 and the outer layer 15 can be formed to be thicker than the metal layer 13. By configuring as above, flattening of the electromagnetic shielding tube 3 can be prevented particularly at the time of bending. That is, by forming the inner layer 11 with the sufficient thickness, it is possible to prevent the metal layer 13 from being flattened inwardly. Furthermore, by forming the outer layer 15 with a sufficient thickness, flattening of the metal layer 13 can be prevented as well. It is desired that the thickness of the resin of the inner layer 11 and that of the outer layer 15 are formed to be equal and well-balanced. Meanwhile, when a protective effect on the metal layer 13 can be kept enough, unless the inside diameter of the shielded tube becomes too small, it is more desired to form the inner layer 11 with more thickness than the outer layer 15 because the restoring force becomes large at the time of bending. For example, when the metal layer 13 is bended and an outer periphery of a bending portion crushes, a diameter of a direction that is identical to a direction of bending the metal layer 13 reduces. Furthermore, a diameter of a direction that is perpendicular to the direction of bending increases and becomes flat. In contrast, the outer layer 15 according to the present invention provides the action force for tying to return to the original unprocessed shape of circle to the metal layer 13, which makes it possible to prevent the flattening of the metal layer 13.

The metal layer 13 requires the thickness enough to obtain the necessary shielding property. Furthermore, the thickness of the metal layer 13 is set so that, when bending the electromagnetic shielding tube 3, the rigidity of the metal layer 13 in a bending state becomes larger than the restoring force from which the inner layer 11 and the outer layer 15 return to the original state. That is, when bending the electromagnetic shielding tube 3, plastic deformation of the metal layer 13 inside thereof occurs and elastic deformation of the inner layer 11 and the outer layer 15 occurs by plasticity of their own. In contrast, if the rigidity of the metal layer 13 at the bending state is larger than the restoring force accompanied with the plastic deformation of the inner layer 11 and the outer layer 15, the electromagnetic shielding tube 3 can maintain its shape at the bending state.

Figure 3:
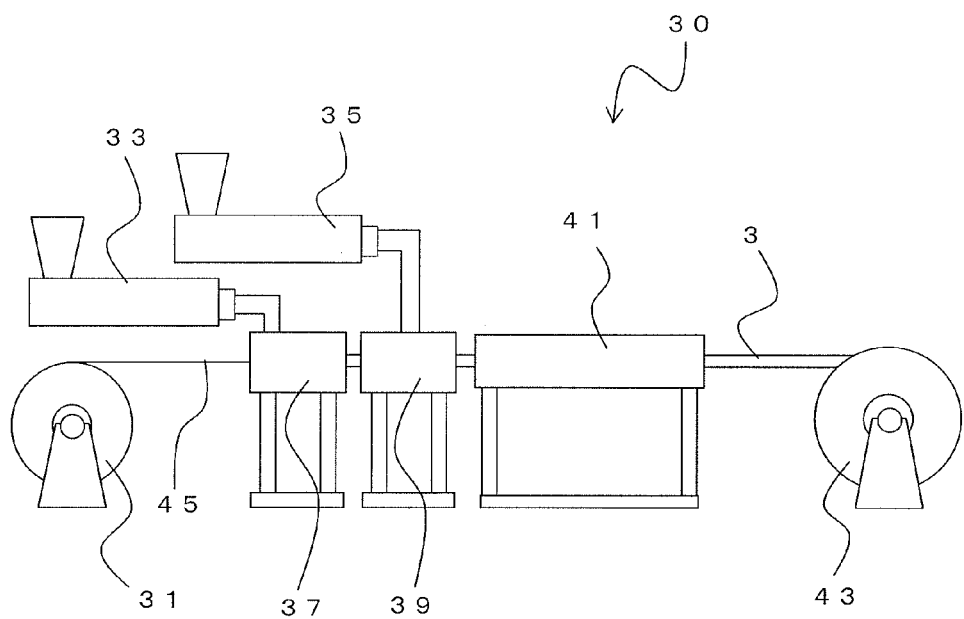
FIG. 3 illustrates a manufacturing process of an electromagnetic shielding tube 3.

Next, a method for manufacturing the electromagnetic shielding tube 3 will be described. FIG. 3 illustrates an electromagnetic-shielding-tube manufacturing device 30. The electromagnetic-shielding-tube manufacturing device 30 includes a metal-strip supplying unit 31, an inner-layer-resin extruding machine 33, an outer-layer-resin extruding machine 35, multilayer fabricating dices 37 and 39, a cooling water pool 41, and a reeling device 43, etc. The metal-strip supplying unit 31 sends a metal strip 45 (including a sheet of metal) that serves as a strip-shaped member which constitutes the metal layer 13 to the multilayer fabricating dice 37. Inner layer resin which constitutes the inner layer 11 is sent to the multilayer fabricating dice 37. In the multilayer fabricating dice 37, the inner layer 11 is formed and the metal strip 45 is fabricated in the shape of a roll by a forming method such that ends in a width direction of the metal strip 45 are wrapped with each other so as to form a wrapping portion and the wrapping portion is set to be on an outer periphery of the inner layer 11. In this way, the metal layer 13 is formed on the outer periphery of the plastic tube of the inner layer 11.

Furthermore, the outer-layer-resin extruding machine 35 sends outer layer resin that constitutes the outer layer 15 to the multilayer fabricating dice 39. In the multilayer fabricating dice 39, the outer layer resin is extruded and covers an outer periphery of the metal layer 13. The obtained electromagnetic shielding tube 3 is cooled by the cooling water pool 41 and reeled off by the reeling device 43. In this way, the electromagnetic shielding tube 3 is manufactured. In order to join the wrapping portion, it can be welded or brazed by a welder or a brazing device which can be placed between the inner-layer-resin extruding machine 33 and the outer-layer-resin extruding machine 35 after forming the wrapping portion by the forming method and before covering it with the outer layer resin.

When the metal layer is fabricated in the shape of substantially a circle by the forming method, it is desired to set the length of the wrapping portion to be 4% to 10% of the peripheral length of the circular cross-sectional surface after fabrication, and more preferably, to set it to be approximately 4% to 8% of the same. For example, when fabricating the circular cross-sectional surface of which the diameter is 22 mm by a roll forming method, the length of the wrapping portion is set to be 4 mm so that the length of the wrapping portion can be approximately 5.8% of the peripheral length of the circular cross-sectional surface after fabrication. When setting the wrapping portion to be too short, the shape of the metal layer is not stabilized, meanwhile when setting the wrapping portion to be too long, resistance at the time of bending becomes large.

When the outer layer 15 is extruded and covered, a mark (coloring) that is continuous in an axis direction of the tube can be provided at a position corresponding to the wrapping portion or a center of the wrapping portion of the metal layer 13 so that the position of the wrapping portion can be viewed from an outside surface.

By the manufacturing process above, as illustrated in FIG. 2 (*b*), the wrapping portion 17 is formed on a part of the metal layer 13. Because the wrapping portion 17 is pressed from an outside when the outer layer 15 is covered, both ends of a sheet metal contact with each other certainly. Therefore, at a cross-sectional surface illustrated in FIG. 2 (*b*), a gap is not formed in the metal layer 13 forming a shielding layer.

Before being covered by the outer layer 15, at least a part of the wrapping portion 17 can be joined by bat welding, ultrasonic welding, or brazing, etc., meanwhile, the wrapping portion 17 can be formed without such a joint but just be in a state where the both ends thereof contact with each other. Additionally, the wrapping portion 17 can be configured such that some parts of the wrapping portion 17 contact directly and the other parts thereof are joined with adhesives. In any methods, it is desired that the metal layer 13 is formed successively (continuously) in a circumferential direction. By forming as above, it is able to secure a certain level of the shielding property.

Figure 4:
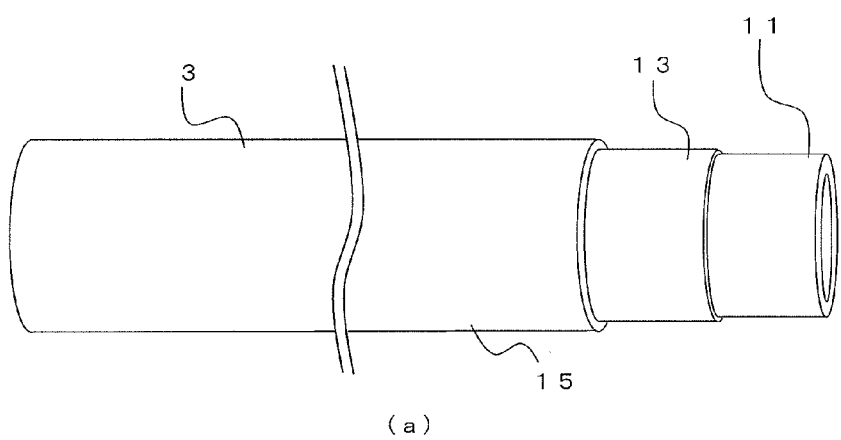
FIG. 4 illustrates another configuration of an electromagnetic shielding tube 3.
Figure 4:
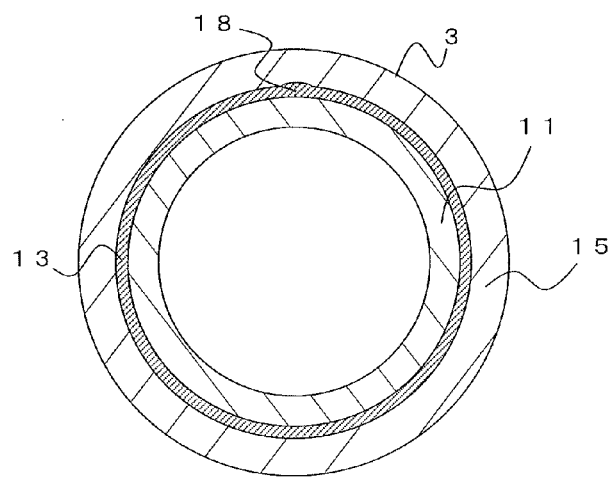

As illustrated in FIG. 4, butt-welding can be performed without forming the wrapping portion 17. In this case, a sheet metal is fabricated in the shape of a roll such that each end of the sheet metal is butted (a butting portion 18), and then the butting portion 18 is joined by welding. Also in this case, because the metal layer 13 is formed continuously in a circumferential direction, it is possible to secure a certain level of the shielding property. In order to secure the electromagnetic shielding property, it is desired that each end of the metal sheet is joined or contacts with each other at any position in the circumferential direction. On the other hand, when some decrease in a level of the shielding property can be allowed, each end can not necessarily contact with each other.

When the wrapping portion 17 is not joined but simply each end of the sheet metal contacts with each other, each end at the wrapping portion 17 can slide on a contacting surface thereof at the time of bending the electromagnetic shielding tube 3. That is, the wrapping portion 17 can slightly open and close in a circumferential direction in association with deformation by bending, and accordingly it is possible to absorb the deformation and prevent the metal layer 13 from being flattened. However, the strength of the tube and a level of the electromagnetic shielding property in a case where each end of the sheet metal simply contacts with each other are slightly inferior to that of a case where the wrapping portion 17 is joined by such as welding. The wrap length of the wrapping portion 17 can be set within a range where a gap is not generated in the metal layer 13 by opening of the wrapping portion 17 at the time of bending the electromagnetic shielding tube 3.

As such an electromagnetic shielding tube, for example, a tube of which the inside diameter is 20 mm, the thickness of the inner layer 11 is 0.5 mm, the thickness of the metal layer 13 is 0.5 mm, the thickness of the outer layer 15 is 1 mm, and the outside diameter is 24 mm can be used. The electromagnetic shielding tube 3 of which the inner layer 11 and the outer layer 15 is made of polypropylene and the metal layer 13 is made of aluminum can be bended easily by a hand bender.

An adhesion layer or the like can be provided between the inner layer 11 and the metal layer 13 or between the metal layer 13 and the outer layer 15, respectively. In the present invention, the metal layer 13 formed on the outer periphery of the inner layer 11 is not necessarily limited to a case where the metal layer 13 contacts with the inner layer 11, or rather, a case where other layer is formed between the inner layer 11 and the metal layer 13 is also included.

Similarly, the outer layer 15 made of plastic and formed on the outer periphery of the metal layer 13 is not necessarily limited to a case where the outer layer 15 contacts with the metal layer 13, or rather, a case where other layer is formed between the metal layer 13 and the outer layer 15 is also included.

Furthermore, a unit of layers in which the inner layer 11, the metal layer 13, and the outer layer 15 are integrally formed does not simply mean the ones in which the inner layer 11, the metal layer 13, and the outer layer 15 directly contact with each other to be integrated, or rather, it also includes a case where respective layers are integrated even when other layers are formed between the inner layer 11 and the metal layer 13 or between the metal layer 13 and the outer layer 15. For example, it includes a case where the layers are integrated as a whole, in which an adhesion layer is provided between the inner layer 11 and the metal layer 13 or between the metal layer 13 and the outer layer 15, respectively.

Figure 5:
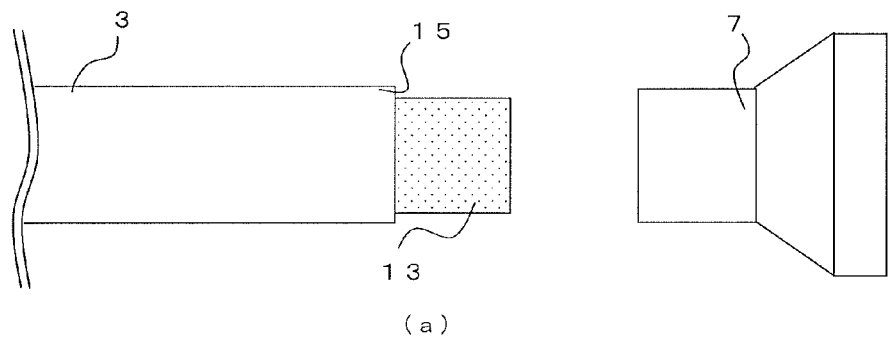
FIG. 5 illustrates a process of attaching a terminal 7 to a terminal of an electromagnetic shielding tube 3.
Figure 5:
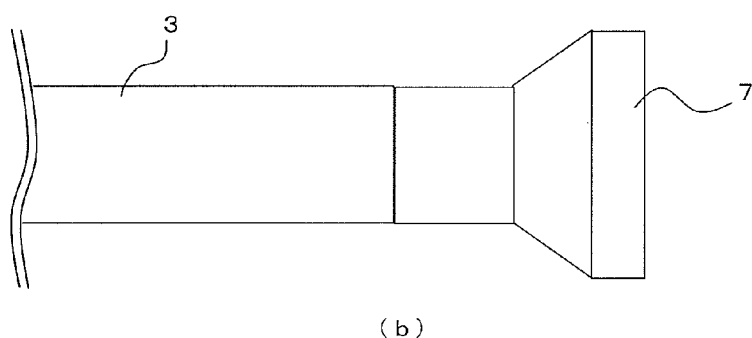
Figure 5:
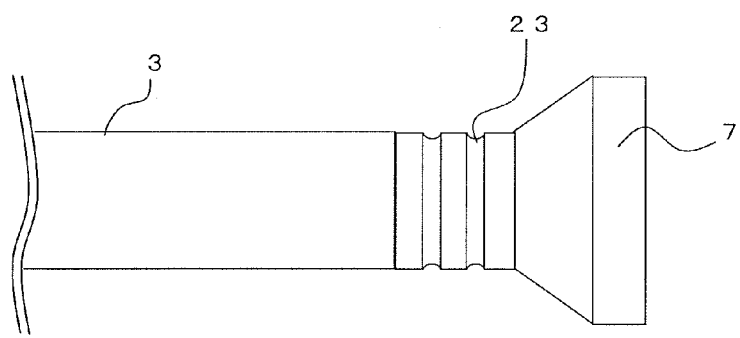

Next, a method for processing a terminal of the electromagnetic shielding tube 3 (a method for attaching a terminal 7) will be described. FIG. 5 illustrates a process of attaching a terminal 7. First, as illustrated in FIG. 5 (*a*), a predetermined range of the outer layer 15 is peeled from a terminal of the electromagnetic shielding tube 3. That is, the internal metal layer 13 is exposed on a part of an end portion of the electromagnetic shielding tube 3.

As illustrated in FIG. 5 (*b*), the terminal 7 is attached to the terminal of the electromagnetic shielding tube 3 from the state above. Furthermore, a swaging portion 23 of the terminal 7, which is illustrated in FIG. 5 (*c*), is swaged by a hydraulic tool, etc. The swaging portion 23 is set to be located at a position that corresponds to an exposed portion of the metal layer 13 when electromagnetic shielding tube 3 is covered by the swaging portion 23.

At least an inner surface of a body of the terminal 7 is made of metal. Accordingly, by swaging the terminal 7 at the swaging portion 23, the terminal 7 and the metal layer 13 can certainly contact with each other. That is, it is possible to conduct the metal layer 13 with the terminal 7. Therefore, when the body of the terminal 7 is made of plastic, the terminal 7 can function as a shielding layer with respect to a connecting portion of a cable or the like that is in the inside of the terminal 7. The terminal 7 is connected so as to be conducted with a device subject to connection, etc. and is grounded suitably.

Figure 6:
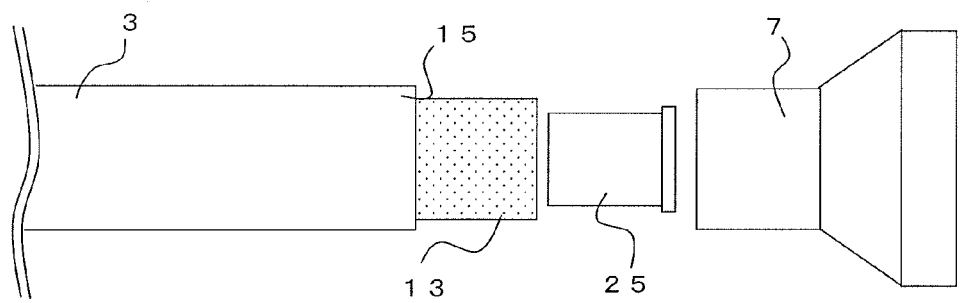
FIG. 6 illustrates another process of attaching a terminal 7 to a terminal of an electromagnetic shielding tube 3.

FIG. 6 illustrates another process of attaching the terminal 7. In an example illustrated in FIG. 6, a sleeve 25 is inserted beforehand into the end portion of the electromagnetic shielding tube 3. It is only necessary for the sleeve 25 to have more than a certain level of the rigidity with respect to the electromagnetic shielding tube 3. For example, the sleeve 25 is desired to be made of a material which is harder than that of the metal layer 13. After inserting the sleeve 25 into the end portion of the electromagnetic shielding tube 3, the terminal 7 is attached and then swaged to connect the terminal 7 to the electromagnetic shielding tube 3 in the same manner illustrated in FIG. 5 (b) to FIG. 5 (c).

It is possible to reinforce the end portion of the electromagnetic shielding tube 3 by inserting the sleeve 25 into the end portion of the electromagnetic shielding tube 3 beforehand. Accordingly, it is possible to prevent the end portion of the electromagnetic shielding tube 3 from being crushed when the terminal 7 is attached and then swaged. In this way, the terminal 7 can be certainly swaged with the end portion of the electromagnetic shielding tube 3.

Figure 7:
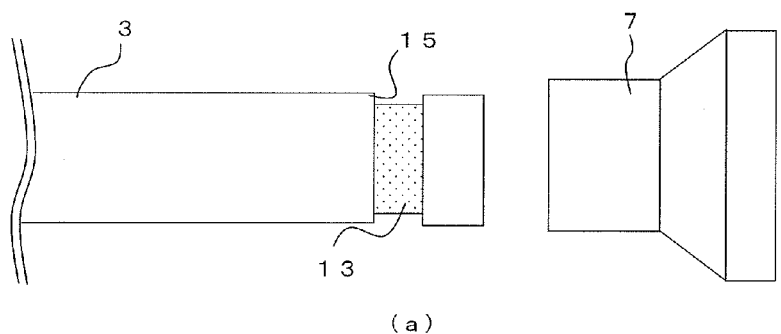
FIG. 7 illustrates a further process of attaching a terminal 7 to a terminal of an electromagnetic shielding tube 3.
Figure 7:
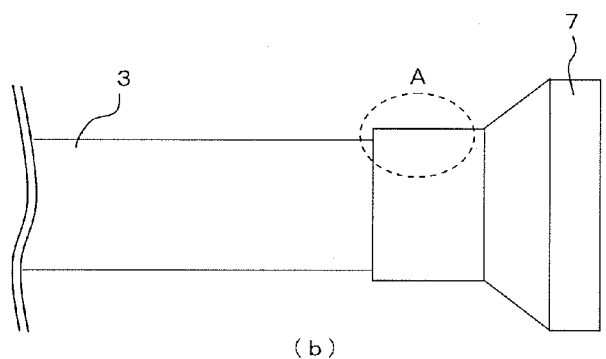
Figure 7:
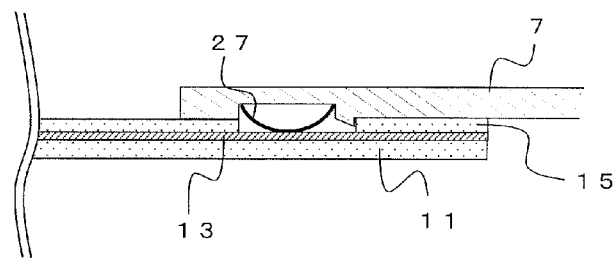

FIG. 7 illustrates a further other process of attaching the terminal 7. In an example illustrated in FIG. 7, as illustrated in FIG. 7 (a), a part of the outer layer 15 in a position where is a predetermined distance away from the end portion of the electromagnetic shielding tube 3 is peeled so that the internal metal layer 13 is exposed. That is, the metal layer 13 becomes exposed over an entire periphery in the shape of a strip. In this state, as illustrated in FIG. 7 (b), the terminal 7 is attached to the end portion of the electromagnetic shielding tube 3.

FIG. 7 (c) is an enlarged view of the section A in FIG. 7 (b). A spring 27 is provided in the inner surface of the terminal 7. The spring 27 is a ring-shaped spring made of metal. When the terminal 7 is attached to the end portion of the electromagnetic shielding tube 3, the spring 27 disposed in the inner surface of the terminal 7 is pressed against the metal layer 13. That is, it is possible to contact and conduct the spring 27 with the metal layer 13 with each other. The inner surface of the terminal 7 is made of metal and the spring 27 contacts with the inner surface of the terminal 7. Accordingly, the spring 27 and the terminal 7 can conduct with each other, and moreover, the terminal 7 and the metal layer 13 can conduct with each other.

Figure 8:
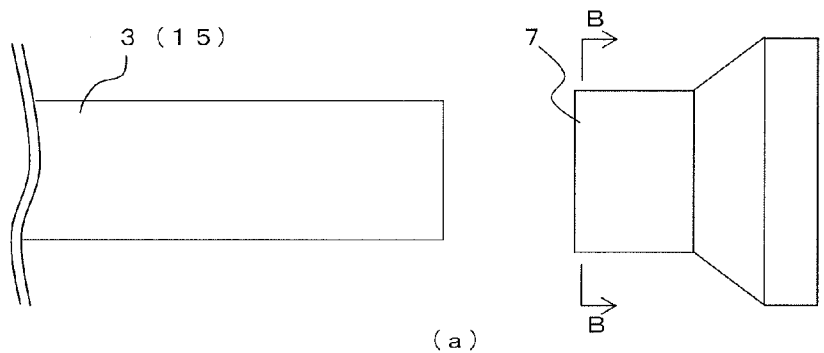
FIG. 8 illustrates a still further process of attaching a terminal 7 to a terminal of an electromagnetic shielding tube 3.
Figure 8:
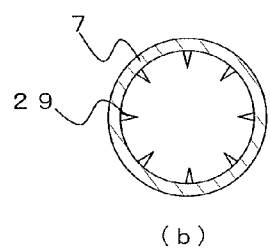
Figure 8:
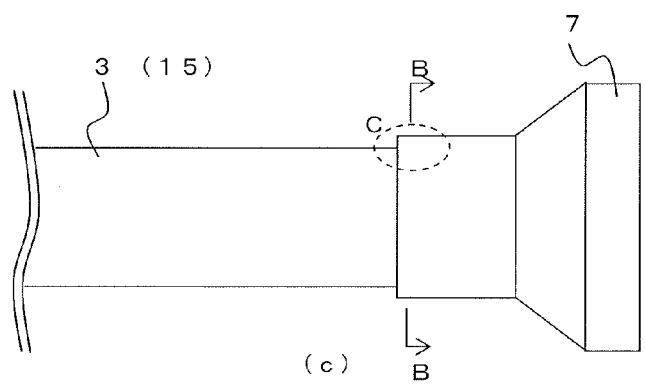
Figure 8:
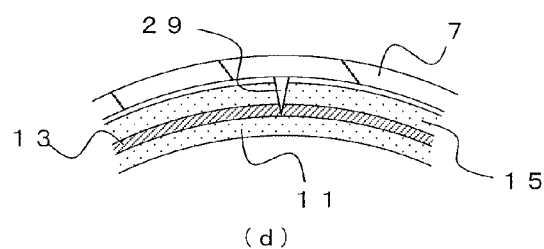

FIG. 8 illustrates a still further process of attaching the terminal 7. In an example illustrated in FIG. 8, as illustrated in FIG. 8 (a), it is not necessary to peel the outer layer 15 from the end portion of the electromagnetic shielding tube 3 before attaching the terminal 7. FIG. 8 (b) is a B-B line cross-sectional view of FIG. 8 (a). As illustrated in FIG. 8 (b), a plurality of teeth 29 are provided in the inner surface of the terminal 7 in a centrally-directed manner. The teeth 29 are projections made of metal of which the tips are sharp. That is, the teeth 29 and the terminal 7 conduct with each other.

As illustrated in FIG. 8 (c), the terminal 7 including the teeth 29 is attached to the end portion of the electromagnetic shielding tube 3. FIG. 8 (d) is a B-B line cross-sectional view near the section C in a state above. As illustrated in FIG. 8 (d), the teeth 29 penetrate through the outer layer 15 and the tips thereof contact with the metal layer 13. In this way, it is possible to conduct the teeth 29 with the metal layer 13, and accordingly, the metal layer 13 and the terminal 7 can conduct with each other. When the terminal configured as the one illustrated in FIG. 8 is used, it is desired that the outer layer 15 is formed to be thinner than the inner layer 11 so that the teeth 29 can easily penetrate through the outer layer 15.

A method for attaching the terminal 7 to the electromagnetic shielding tube 3 is not limited to the methods described above as long as it is possible to ground the metal layer 13 at the end portion of the electromagnetic shielding tube 3. For example, as long as it is able to ground the metal layer 13 to an outside at the both ends of the electromagnetic shielding tube 3, the terminal 7 is not necessarily used for grounding.

Figure 9:
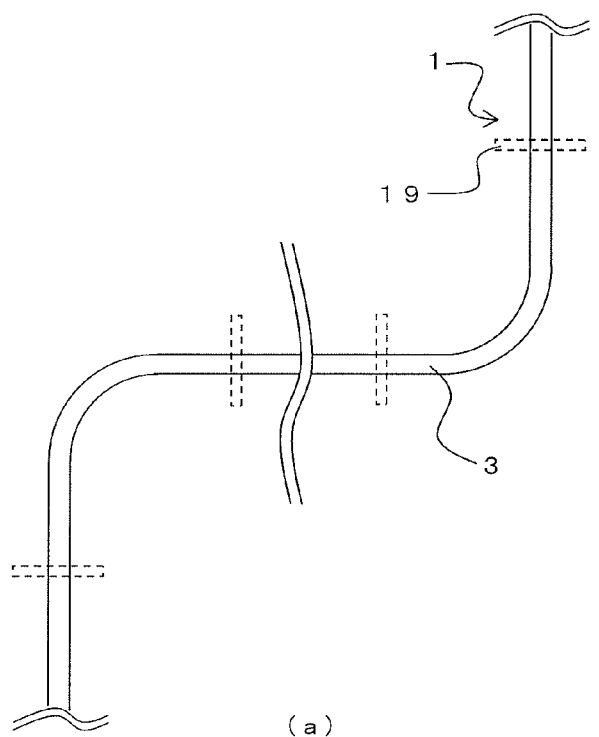
FIG. 9 illustrates a state where a shielded cable is laid.
Figure 9:
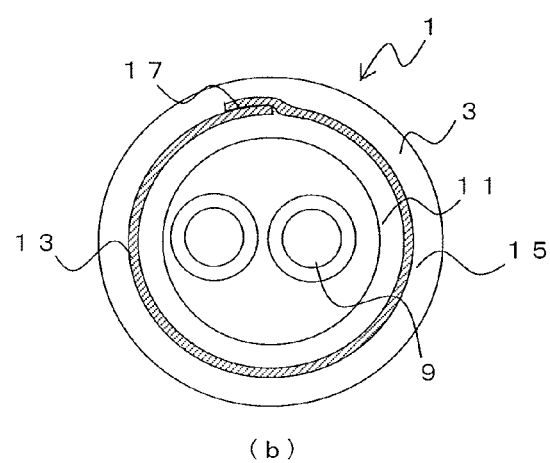

Next, a shielded cable laying structure using the shielded cable 1 according to the present invention will be described. FIG. 9 (a) illustrates a shielded cable laying structure, and FIG. 9 (b) is a cross-sectional view of the shielded cable 1. A configuration of a shielded cable to be laid is not limited to the illustrated example.

The shielded cable 1 is laid on a bottom portion of an automobile, etc. in a predetermine layout and fixed to a body thereof with a predetermined interval. A predetermined portion of the shielded cable 1 is bended beforehand with a predetermined curvature and the shielded cable 1 is fixed partially by using a fixing member 19. Such a bending portion is not necessarily limited to the illustrated bending configuration, or rather, the angle of bending and the radius of the curvature is set in accordance with a layout.

The shielded cable 1 is bended by such as pressing. For example, the shielded cable 1 can be bended in a plurality of different directions. With such a configuration, the shielded cable 1 can be formed in a three-dimensional shape instead of on the same plane. In this case, for example, the computerized three-dimensional bending as mentioned above can be performed. The three-dimensional bending is performed only by changing the angle of the curvature of a processing head and does not require a metallic mold such as a bending press, and accordingly it is easy to respond to demands of changes in the shape of curvature of an electromagnetic shielding tube.

An electric wire 9 which is, for example, a high-voltage power wire is inserted into the inside of the shielded cable 1. Although an example in which the two electric wires 9 are inserted therein is illustrated in FIG. 9, the present invention is not limited to the example above.

In the shielded cable laying structure, for example, the two electric wires 9 of which the diameter is 8 mm are inserted into the above-mentioned shielded cable (the internal diameter is 20 mm), one of the end portions (the terminal) is connected to an inverter (not shown), and the other end portion (the terminal) is connected to a motor (not shown) or the like. The metal layer 13 is electrically connected to an electrically-conductive shielding case (not shown) that accommodates an inverter therein.

It is desired for a bending direction of a shielded cable (an electromagnetic shielding tube) to be set such that the wrapping portion 17 corresponds to a bending plane. In other words, corresponding to the bending plane means herein that it is desired to bend the electromagnetic shielding tube such that the wrapping portion is set to be located on an outer periphery or an inner periphery of a bending portion of the bended electromagnetic shielding tube. By configuring as above, it is possible to increase the rigidity of the bending portion at the time of bending the electromagnetic shielding tube, which makes it possible to produce the higher shape retaining property. When the electromagnetic shielding tube is bended in a plurality of different directions, the wrapping portion 17 is set to correspond to a bending plane of at least one of the bending directions.

As described above, the electromagnetic shielding tube according to the embodiment of the present invention has the shielding property because the metal layer 13 is provided as an intermediate layer. Furthermore, the inner layer 11, the metal layer 13, and the outer layer 15 are integrally formed, and accordingly each position of the respective layers in an axis direction thereof does not gets out of each alignment position and the inside metal layer does not fall off.

Furthermore, the rigidity of the metal layer 13 is larger than the restoring force accompanied with elastic deformation of the other layers such as the inner layer 11 and the outer layer 15, and accordingly it is possible to maintain the bended shape at the time of bending. In this process, the metal layer 13 can be easily bended because it is thinner than a conventional metal tube. Therefore, by having the tube bended beforehand in accordance with a laying configuration of a shielded cable, workability at the time of laying a shielded cable (an electromagnetic shielding tube) increases and the number of use in the fixing member 19 with respect to an automobile can be reduced as compared to those of a flexible tube, etc.

Furthermore, the inner layer 11 and the outer layer 15 are made of plastic, and accordingly the electromagnetic shielding tube 3 is not corroded by adhesion of water from an outside, permeation of water into the inside of the tube, and dew condensation, etc. In addition, because the inner layer 11 and the outer layer 15 have heat insulation effectiveness, it is possible to prevent dew condensation from occurring.

Furthermore, by setting the thickness of the inner layer 11 and the outer layer 15 to be thicker than that of the metal layer 13, it is possible to prevent a bending portion of the metal layer 13 from being flattened (buckled) at the time of bending the electromagnetic shielding tube 3.

Furthermore, the metal layer 13 is configured by a stripshaped member, and accordingly the electromagnetic shielding tube 3 can be easily manufactured. In addition, a wrapping portion is formed and it is possible to secure a certain level of the shielding property because each end portion of the stripshaped member contacts with each other at the wrapping portion. Moreover, when the contacting surfaces of the wrapping portion are not joined but configured to be capable of sliding, it is possible to prevent the metal layer 13 from being flattened at the time of bending.

Furthermore, for example, by adding fire retardants and additive agents for improving weather resistance only to the outer layer, the property of the electromagnetic shielding tube 3 can be increased. In addition, it is possible to color the outer layer only. In this process, the inner layer 11 does not require additive agents because it needs neither flame retardance nor weather resistance. Therefore, it is possible to reduce use of additive agents as compared to a plastic tube or the like that is integrally configured.

Figure 10:
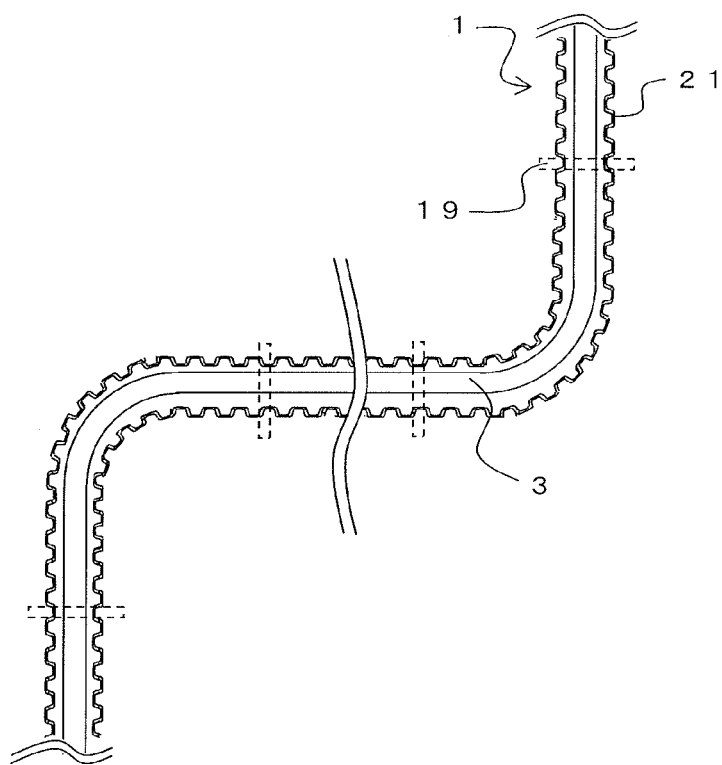
FIG. 10 illustrates another state where a shielded cable is laid.

Next, another embodiment will be described. FIG. 10 illustrates another laying structure of the shielded cable 1. Hereinafter, the same numerals as those of FIG. 1 to FIG. 9 are allotted to configurations having substantially the same functions as those illustrated in FIG. 1 to FIG. 9, and the overlapping explanations will be omitted.

A shielded cable laying structure illustrated in FIG. 10 has substantially the same configuration as that of the shielded cable laying structure illustrated in FIG. 9, however, they are different with each other in that an outer tube 21 is provided on an outer periphery of the shielded cable 1 in the shielded cable laying structure illustrated in FIG. 10. The outer tube 21 is, for example, a plastic corrugated tube. The outer tube 21 is used for protecting the shielded cable 1 from an outside.

Figure 11:
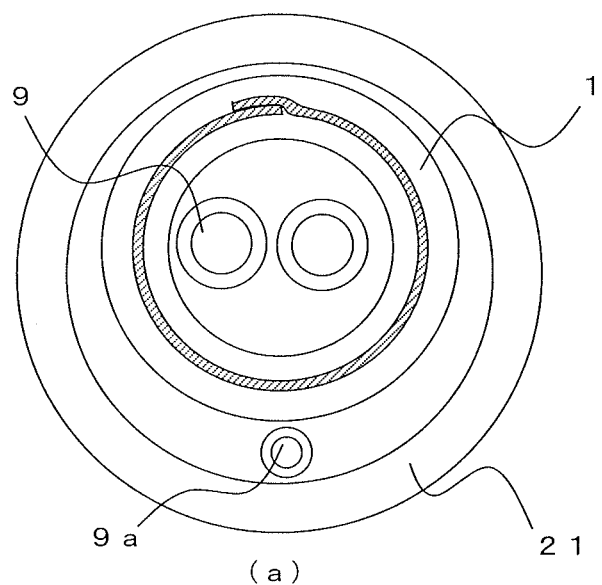
FIG. 11 illustrates an example of a shielded cable in which an outer tube 21 is provided.
Figure 11:
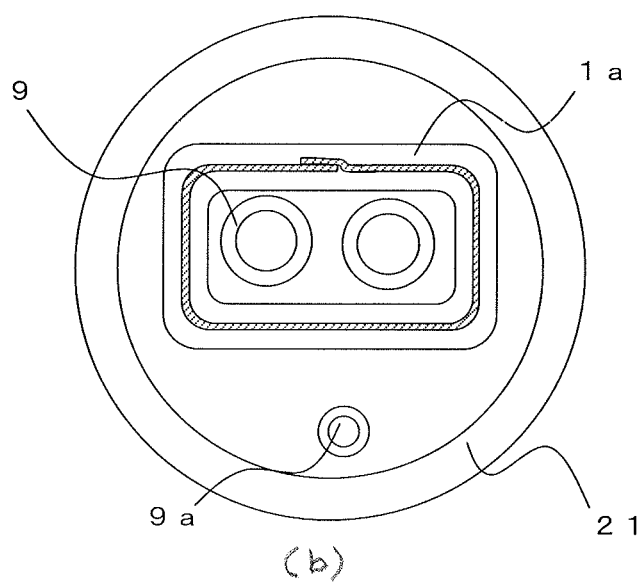

FIG. 11 is a cross-sectional view of the shielded cable 1 provided with the outer tube 21. For example, as illustrated in FIG. 11 (a), an electric wire 9a can be provided between the outer tube 21 and the shielded cable 1. The electric wire 9a is, for example, a low-voltage electric wire or a signal cable that is a covered electric wire into which a weak current such as an electronic power system of a low voltage flows.

With the configuration above, the electric wire 9 (the shielded cable 1) that serves as a high-voltage electric wire and the electric wire 9a that serves as a low-voltage electric wire can be laid collectively. The electric wire 9 is inserted into the inside of the electromagnetic shielding tube 3, and accordingly noise from the electric wire 9 is shielded. Therefore, the electric wire 9a that is inserted into a gap generated between the electromagnetic shielding tube 3 and the outer tube 21 is not influenced by the noise from the electric wire 9.

As illustrated in FIG. 11 (b), the shielded cable 1 can be formed in the shape of a rectangle. Furthermore, the outer tube 21 can be rectangular (not shown). That is, it is possible to effectively arrange the electric wire 9a at the inside by forming at least either the outer tube 21 or the electromagnetic shielding tube 3 in the shape of a rectangle. Moreover, by forming it in the shape of a rectangle, it is possible to achieve space-saving because it is easily placed even in a small space under an automobile. It is also possible to place a plurality of the electric wires while the only one electric wire 9a is placed in the inside of the outer tube 21 herein.

The embodiments are described above with reference to the attached drawings, however, the technical scope of the present invention is not limited by the embodiments above. It is obvious that a person skilled in the art can easily make the various examples of change or modifications within the category of the technical idea described in the claim, and moreover, it is understood that such examples naturally belong to the technical scope of the present invention.

Figure 12:
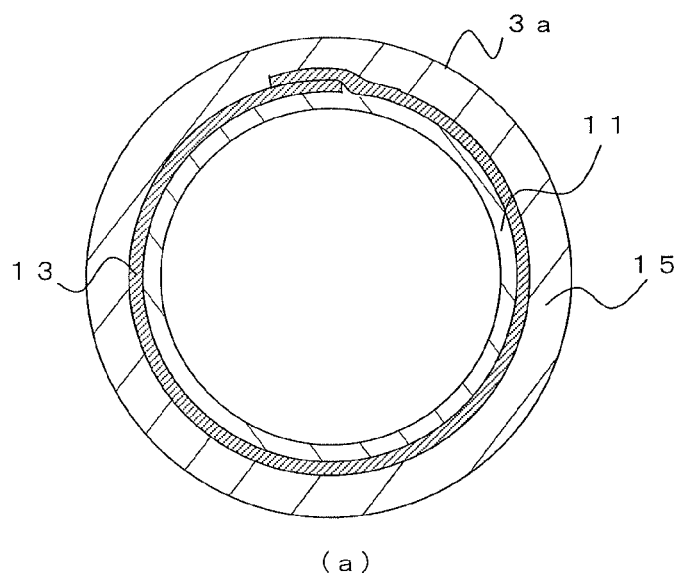
FIG. 12 (a) illustrates an electromagnetic shielding tube 3a, and FIG. 12 (b) illustrates an electromagnetic shielding tube 3b.
Figure 12:
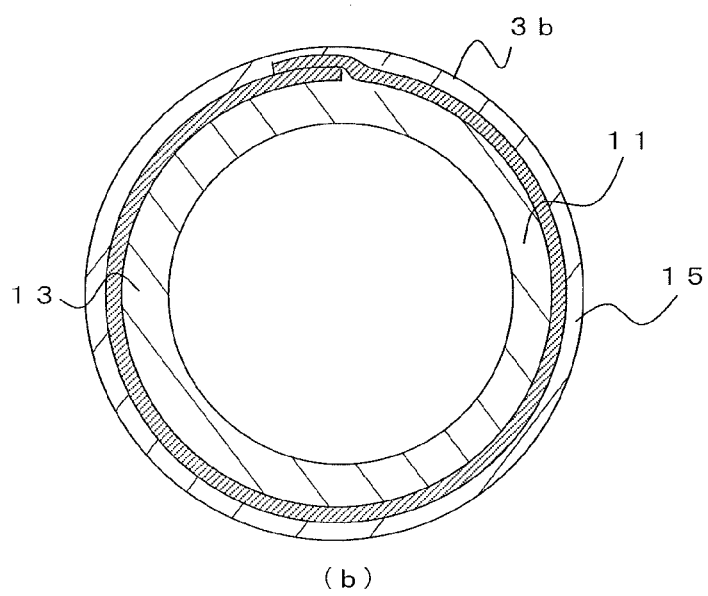

For example, the thickness of the inner layer 11 and the outer layer 15 can be set suitably in accordance with the required properties. FIG. 12 (a) illustrates an electromagnetic shielding tube 3a of which the inner layer 11 is set to be thin and the outer layer 15 is set to be thick. The electromagnetic shielding tube 3a has the extremely high resistance to an external wound. That is, even when a stone or the like collides from an outside, the metal layer 13 does not receive damage because the outer layer 15 is thick enough. Furthermore, it is possible to prevent a cross-sectional surface from being flattened at the time of bending the electromagnetic shielding tube 3a.

In the electromagnetic shielding tube 3, because a distance from the outer periphery to the metal layer 13 is set to be long, even when water permeates into the resin from an outside, the corrosion of the metal layer 13 can be more prevented. Furthermore, even when the inner layer 11 is formed to be thin within a range that does not affect the shape retaining property or the like, an effect with respect to resistance to corrosion, etc can be obtained because the metal layer 13 is not exposed.

As illustrated in FIG. 12 (b), an electromagnetic shielding tube 3b of which the inner layer 11 is set to be thick and the outer layer 15 is set to be thin can be used. The electromagnetic shielding tube 3b can certainly prevent the flattening of the metal layer 13 which may be caused by an outer periphery surface of the bending portion being moved toward a side of an inner periphery surface by bending. In this way, an inside diameter does not become small, and accordingly workability for inserting an electric wire can be increased.

The electromagnetic shielding tube 3b has the thin outer layer 15, and accordingly even when additive agents and pigments are added only to the outer layer, it is possible to reduce use of additive agents and pigments because the resin that constitutes the outer layer can be reduced. Furthermore, even when the outer layer 15 is formed to be thin within a range that does not affect the shape retaining property or the like, an effect with respect to resistance to corrosion, etc can be obtained because the metal layer 13 is not exposed.

DESCRIPTION OF NOTATIONS 1, 1a shielded cable
3, 3a, 3b Electromagnetic shielding tube
7 Terminal
9 9a Electric wire
11 Inner layer
13 Metal layer
15 Outer layer
17 Wrapping portion
19 Fixing member 21 Outer tube
23 Swaging portion
25 Sleeve
27 Spring
29 Tooth
30 Electromagnetic-shielding-tube manufacturing device
31 Metal-strip supplying unit
33 Inner-layer-resin extruding machine
35 Outer-layer-resin extruding machine
37 Multilayer fabricating dice
39 Multilayer fabricating dice
41 Cooling water pool
43 Reeling device
45 Metal strip

The invention claimed is:

1. An electromagnetic shielding tube that enables an electric wire to be inserted therein, comprising:
   an inner layer made of plastic;
   a metal layer formed on an outer periphery of the inner layer;
   an outer layer made of plastic and formed on an outer periphery of the metal layer, wherein
   the electromagnetic shielding tube is a multiple-unit tube in which the inner layer, the metal layer, and the outer layer are integrally formed,
   the electromagnetic shielding tube has shape retaining property that keeps a bending shape by rigidity after plastic deformation of the metal layer, which is larger than restoring force accompanied with elastic deformation of the inner layer and the outer layer after the electromagnetic shielding tube is bended,
   both ends of a metal sheet member are overlapped with each other in a wrapping portion to form the metal layer, and
   the wrapping portion is formed in a shape of a roll such that facing surfaces of both the ends of the metal sheet member contact with each other without being joined.

2. The electromagnetic shielding tube according to claim 1, wherein
   at least either thickness of the inner layer or thickness of the outer layer is thicker than thickness of the metal layer, and
   the thickness of the outer layer is thinner than the thickness of the inner layer, or the thickness of the outer layer is equal to the thickness of the inner layer.

3. The electromagnetic shielding tube according to claim 1, wherein the metal layer is formed by any of aluminum, an aluminum alloy, copper, or a copper alloy.

4. The electromagnetic shielding tube according to claim 1, wherein the outer layer includes an additive agent for improving at least either of flame retardance or weather resistance, and a pigment for coloring is added to the outer layer.

5. The electromagnetic shielding tube according to claim 1, wherein resin that constitutes the inner layer or the outer layer is polyolefin resin or thermoplastic resin.

6. The electromagnetic shielding tube according to claim 1, wherein at least a part of a resin layer covering a surface of the electromagnetic shielding tube is peeled at an end portion in a longitudinal direction of the electromagnetic shielding tube so that the metal layer is exposed.

7. wherein A structure of a shielded cable comprising the electromagnetic shielding tube according to claim 1, wherein a plastic corrugated tube covers an outer periphery of the electromagnetic shielding tube, and an electric wire is further arranged in a gap between the plastic corrugated tube and the electromagnetic shielding tube.

8. A connecting structure of a shielded cable comprising the electromagnetic shielding tube according to claim 1, wherein
   at least a part of a resin layer covering a surface of the electromagnetic shielding tube is peeled at an end portion in a longitudinal direction so that the metal layer is exposed, and
   a terminal portion is connected thereto so as to be conducted with the metal layer.

9. An electromagnetic shielding tube that enables an electric wire to be inserted therein, comprising:
   an inner layer made of plastic;
   a metal layer formed on an outer periphery of the inner layer;
   an outer layer made of plastic and formed on an outer periphery of the metal layer, wherein
   the electromagnetic shielding tube is a multiple-unit tube in which the inner layer, the metal layer, and the outer layer are integrally formed,
   the electromagnetic shielding tube has shape retaining property that keeps a bending shape by rigidity after plastic deformation of the metal layer, which is larger than restoring force accompanied with elastic deformation of the inner layer and the outer layer after the electromagnetic shielding tube is bended,
   both ends of a metal sheet member are overlapped with each other in a wrapping portion to form the metal layer, and
   the wrapping portion is formed in a shape of a roll such that facing surfaces of both the ends of the metal sheet member are directly joined with each other.

10. The electromagnetic shielding tube according to claim 9, wherein
    at least either thickness of the inner layer or thickness of the outer layer is thicker than thickness of the metal layer, and
    the thickness of the outer layer is thinner than the thickness of the inner layer, or the thickness of the outer layer is equal to the thickness of the inner layer.

11. The electromagnetic shielding tube according to claim 9, wherein the metal layer is formed by any of aluminum, an aluminum alloy, copper, or a copper alloy.

12. The electromagnetic shielding tube according to claim 9, wherein the outer layer includes an additive agent for improving at least either of flame retardance or weather resistance, and a pigment for coloring is added to the outer layer.

13. The electromagnetic shielding tube according to claim 9, wherein resin that constitutes the inner layer or the outer layer is polyolefin resin or thermoplastic resin.

14. The electromagnetic shielding tube according to claim 9, wherein at least a part of a resin layer covering a surface of the electromagnetic shielding tube is peeled at an end portion in a longitudinal direction of the electromagnetic shielding tube so that the metal layer is exposed.

15. The electromagnetic shielding tube according to claim 9, wherein a mark that is continuous in an axis direction of the electromagnetic shielding tube is provided at a position, which corresponds to a wrapping portion or a center of the wrapping portion of the metal layer, in the outer layer colored by a pigment.

16. A structure of a shielded cable comprising the electromagnetic shielding tube according to claim 9, a plastic corrugated tube covers an outer periphery of the electromagnetic shielding tube, and an electric wire is further arranged in a gap between the plastic corrugated tube and the electromagnetic shielding tube.

17. The structure of a shielded cable according to claim 16, wherein the electric wire arranged in the gap between the plastic corrugated tube and the electromagnetic shielding tube is a low-voltage electric wire and the electric wire inserted in the inside of the electromagnetic shielding tube is a high-voltage electric wire.

18. A connecting structure of a shielded cable comprising the electromagnetic shielding tube according to claim 9, wherein
- at least a part of a resin layer covering a surface of the electromagnetic shielding tube is peeled at an end portion in a longitudinal direction so that the metal layer is exposed, and
- a terminal portion is connected thereto so as to be conducted with the metal layer.

* * * * *